US005624866A

United States Patent [19]

Kim

[11] Patent Number: 5,624,866
[45] Date of Patent: Apr. 29, 1997

[54] SEMICONDUCTOR DEVICE PROVIDED WITH TRENCH ELEMENT ISOLATION FILM AND METHOD FOR FABRICATING THE SAME

[75] Inventor: Jae K. Kim, Kyoung ki-do, Rep. of Korea

[73] Assignee: Hyundai Electronics Industries Co., Ltd., Rep. of Korea

[21] Appl. No.: 374,807

[22] Filed: Jan. 19, 1995

[30] Foreign Application Priority Data

Jan. 19, 1994 [KR] Rep. of Korea ............... 94-972

[51] Int. Cl.$^6$ ............... H01L 21/76; H01L 21/762
[52] U.S. Cl. ............... 438/426; 438/296; 438/981
[58] Field of Search ............... 437/61, 62, 64, 437/67, 69, 70, 979, 985

[56] References Cited

U.S. PATENT DOCUMENTS

| | | | |
|---|---|---|---|
| 4,578,128 | 3/1986 | Mundt et al. | 437/67 |
| 4,597,164 | 7/1986 | Havemann | 437/62 |
| 4,912,062 | 3/1990 | Verma | 437/70 |
| 5,137,837 | 8/1992 | Chang et al. | 437/67 |
| 5,177,028 | 1/1993 | Manning | 437/67 |

Primary Examiner—Mary Wilczewski
Attorney, Agent, or Firm—Merchant, Gould, Smith, Edell, Welter & Schmidt

[57] ABSTRACT

A semiconductor device with a trench element isolation structure having a trench element isolation film formed to have a small width at the boundary between an active region and a field region, thereby capable of obtaining an improved element isolation function while easily planarizing an insulating film formed in the trench. A thick oxide film is formed at the field region provided with no trench, thereby preventing formation of a parasitic capacitor between the semiconductor substrate and the gate electrode.

5 Claims, 4 Drawing Sheets

SEMICONDUCTOR DEVICE PROVIDED WITH TRENCH ELEMENT ISOLATION FILM AND METHOD FOR FABRICATING THE SAME

BACKGROUND OF THE INVENTION

1. Field of the Invention

The present invention relates to a semiconductor device provided with a trench element isolation film and a method for fabricating the same, and more particularly to a semiconductor device with a trench element isolation structure having a planarized element isolation film formed in a trench of a small width provided at the boundary between an active region and a field region and with a thick oxide film selectively formed on the field region upon forming a gate oxide film and a method for fabricating the semiconductor device.

2. Description of the Prior Art

In fabrication of highly integrated semiconductor devices, conventionally, the local oxidation of silicon (LOCOS) process has been used to form element isolation films for isolating active elements. However, such an element isolation film formed using the LOCOS process defines a reduced active region due to an excessive bird's beak and has an insufficient depth, thereby exhibiting a degraded element isolation function.

FIG. 1 is a layout of masks arranged in fabrication of a metal oxide semiconductor field effect transistor (MOSFET) formed with an element isolation film using the conventional LOCOS process. In FIG. 1, the reference characters A and B denote an element isolation mask and a gate electrode mask. In this case, a region defined inwardly of the element isolation mask A is an active region C whereas a region defined outwardly of the element isolation mask A is a field region D where the element isolation film is formed.

FIG. 2 is a cross-sectional view taken along the line I—I of FIG. 1, showing the formation of element isolation film in accordance with the conventional LOCOS process and the formation of MOSFET at the active region. As shown in FIG. 2, an element isolation film 2 is formed at a field region on a semiconductor substrate 1 by use of the element isolation mask shown in FIG. 1. At an active region on the semiconductor substrate 1, a gate oxide film 3 and a gate electrode 4 are formed. Thereafter, impurity ions of a conduction type different from that of the substrate 1 are implanted in the active region, thereby forming source/drain electrodes 5.

FIG. 3 is a cross-sectional view taken along the line II—II of FIG. 1, showing the formation of element isolation film in accordance with the conventional LOCOS process and the formation of MOSFET at the active region. As shown in FIG. 3, the gate electrode 4 extends laterally such that it overlaps with the element isolation film 2.

Where formation of the element isolation film is achieved using the above-mentioned conventional LOCOS process, the active region is reduced due to an excessive bird's beak. Moreover, the element isolation film has a small depth buried in the semiconductor substrate. As a result, the function of the element isolation film to isolate elements formed at the active region from each other is degraded, thereby causing a leakage current to be generated.

In order to solve this problem involved when the element isolation film is formed using the conventional LOCOS process, there has been proposed formation of an element isolation film having a trench structure.

However, such a trench element isolation film has a problem that where a trench having a large width is formed, the element isolation film buried in the trench is hardly planarized.

SUMMARY OF THE INVENTION

Therefore, an object of the invention is to eliminate the above-mentioned problem encountered in association with the trench having the large width and, thus, to provide a semiconductor device with a trench element isolation structure having a planarized element isolation film formed in a trench of a small width provided at the boundary between an active region and a field region and with a thick oxide film selectively formed on the field region upon forming a gate oxide film and a method for fabricating the semiconductor device.

In accordance with one aspect, the present invention provides a semiconductor device comprising: a trench element isolation film formed in a trenched portion of a semiconductor substrate corresponding to a boundary between a field region and an active region formed with a metal oxide semiconductor field effect transistor, the trench element isolation film having a small width; a thick oxide film formed on a portion of the semiconductor substrate corresponding to a position of the field region formed with no trench; and a gate electrode line overlapping with the active region and the thick oxide film formed at the field region.

In accordance with another aspect, the present invention provides a method for fabricating a semiconductor device, comprising the steps of: forming a trench having a piezo-determined width and a predetermined depth in a portion of a semiconductor substrate corresponding to a boundary between a field region and an active region, and then burying an insulating film in the trench such that the insulating film has a planarized surface, thereby forming a trench element isolation film; implanting an impurity only in a portion of the semiconductor substrate corresponding to the field region, thereby forming an impurity-implanted layer; forming a gate oxide film on a portion of the semiconductor substrate corresponding to the active region and a thick oxide film on the impurity-implanted layer at the field region by use of an oxidation process; and forming a gate electrode overlapping with the gate oxide film and the thick oxide film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
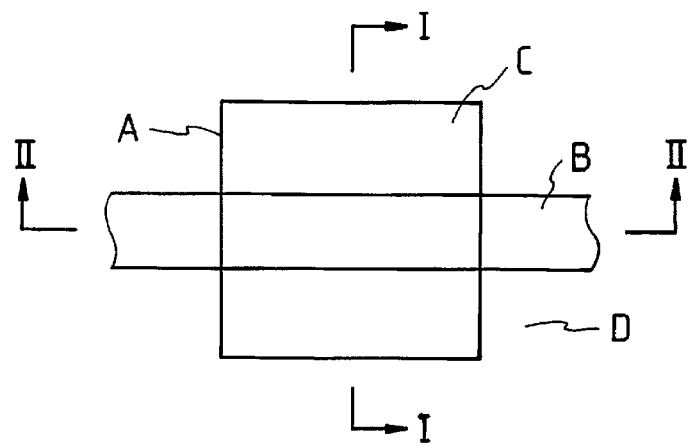
FIG. 1 is a layout view illustrating masks arranged in fabrication of a MOSFET formed with an element isolation film using a conventional LOCOS process.
Figure 2:
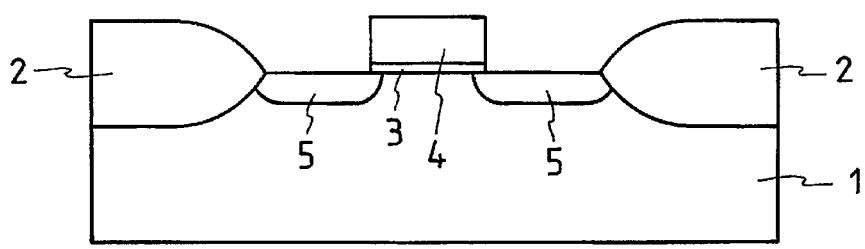
FIG. 2 is a cross-sectional view taken along the line I—I of FIG. 1, showing formation of element isolation film in accordance with the conventional LOCOS process and formation of MOSFET at an active region.
Figure 3:
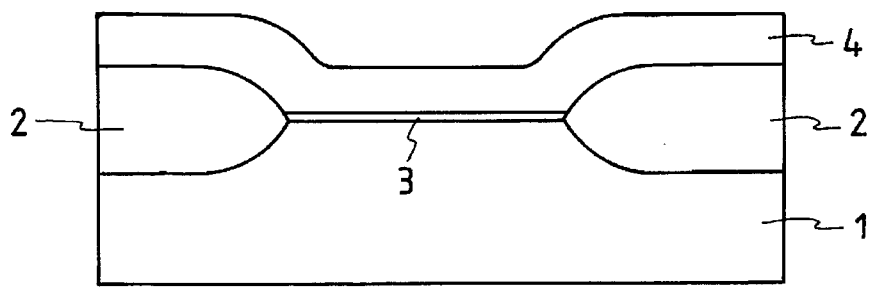
FIG. 3 is a cross-sectional view taken along the line II—II of FIG. 1, showing the formation of element isolation film in accordance with the conventional LOCOS process and the formation of MOSFET at the active region.
Figure 4:
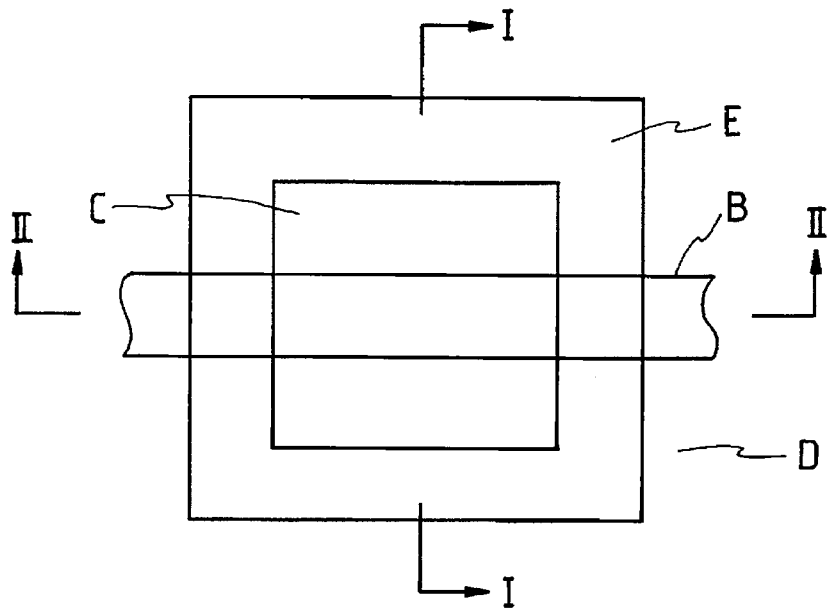
FIG. 4 is a layout view illustrating masks arranged in fabrication of a MOSFET provided with an element isolation film having a trench structure in accordance with the present invention.

FIG. 4 is a layout of masks arranged in fabrication of a MOSFET provided with an element isolation film having a trench structure in accordance with the present invention. In FIG. 4, the reference characters B and E denote a gate electrode mask and a trench element isolation mask. In this case, a region defined inwardly of the trench element isolation mask E is an active region C whereas a region defined outwardly of the trench element isolation mask E is a field region D.

Figure 5:
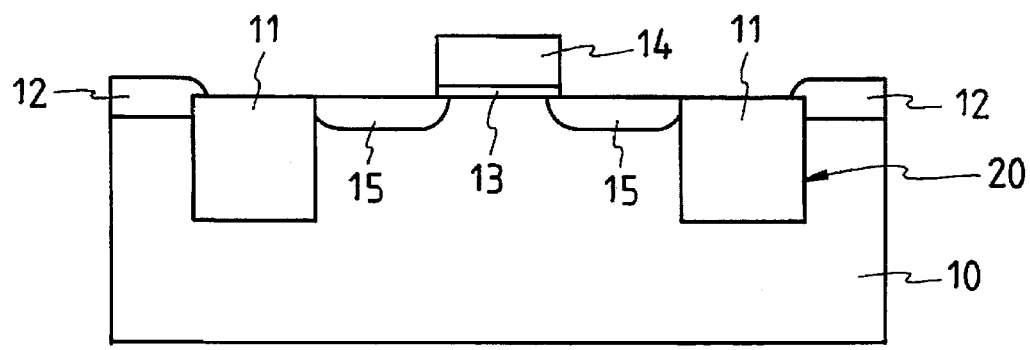
FIG. 5 is a cross-sectional view taken along the line I—I of FIG. 4, showing formation of the trench element isolation film formation of the MOSFET at an active region in accordance with the present invention.

FIG. 5 is a cross-sectional view taken along the line I—I of FIG. 4, showing formation of the trench element isolation film formation of the MOSFET at the active region in accordance with the present invention. As shown in FIG. 5, a trench 20 having a depth of 0.2 to 1 μm and a width of 0.3 to 3 μm is formed on a portion of a semiconductor substrate 10 disposed at a boundary of the active region by use of the trench element isolation mask shown in FIG. 4 in accordance with the present invention. An insulating film is then buried in the trench 20 such that it has a planarized surface, thereby forming a trench element isolation film 11. Using a mask, impurity ions are selectively implanted in a portion of the semiconductor substrate 10 corresponding to the field region. Thereafter, formation of a gate oxide film 13 and a gate electrode 14 is carried out. Impurity ions of a conduction type different from that of the semiconductor substrate 10 are then implanted in the active region, thereby forming source/drain electrodes 15. During the formation of the gate oxide film 13, a thick oxide film 12 is formed on the portion of semiconductor substrate 10 corresponding to the field region because the growth sate of the oxide film is high at the field region.

FIGS. 6 to 9 are cross-sectional views taken along the line II—II of FIG. 4, showing the formation of trench element isolation film and the formation of MOSFET at the active region in accordance with the present invention.

Figure 6:
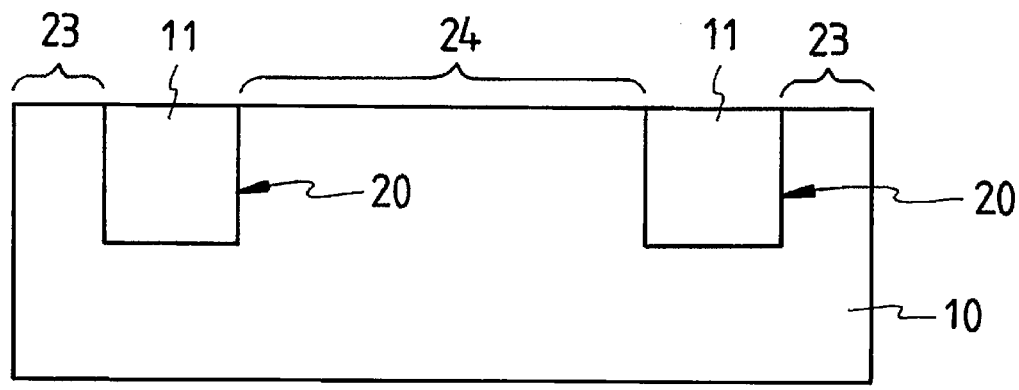
FIGS. 6 to 9 are cross-sectional views taken along the line II—II of FIG. 4, showing the formation of trench element isolation film and the formation of MOSFET at the active region in accordance with the present invention.

FIG. 6 shows the formation of the trench 20 achieved by selecting a portion of the semiconductor substrate 10 corresponding to the boundary portion of the active region denoted by the reference numeral 24 and extending by a predetermined width toward the field region denoted by the reference numeral 23 by use of the trench element isolation mask (the mask E of FIG. 4), etching the selected portion of the semiconductor substrate 10 to a predetermined depth, thereby forming the trench 20, and then burying the insulating film in the trench 20 such that the insulating film has a planarized surface, thereby forming the trench element isolation film 6.

Figure 7:
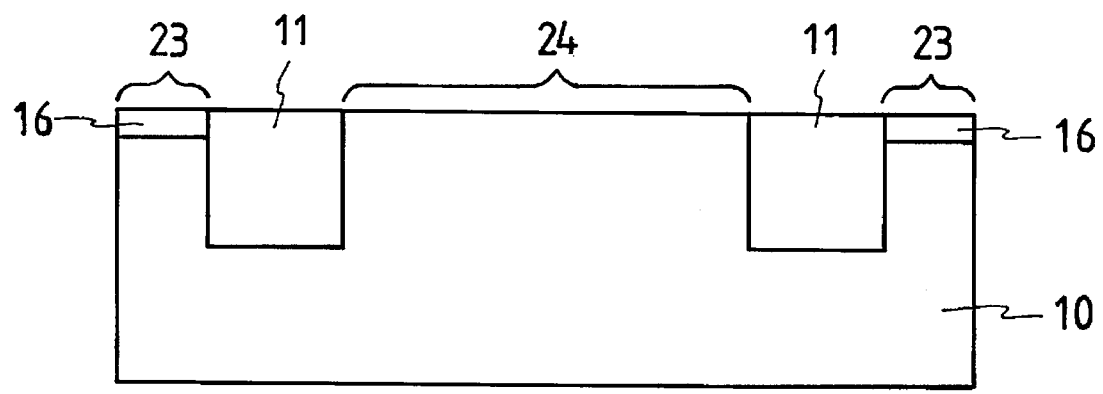

FIG. 7 shows formation of an impurity-implanted layer 16. The impurity-implanted layer 16 is formed by implanting an impurity, which is one selected from a group consisting of arsenic (As), phosphorous (P), argon (Ar), and silicon (Si) of a mixture of two impurities selected from the group, in the portion of semiconductor substrate 10 corresponding to the field region in a concentration of 5E14 to 5E16. During the subsequent formation of the gate oxide film, a thick oxide film is formed on the portion of semiconductor substrate 10 corresponding to the impurity-implanted layer 16 because the growth rate of the oxide film on the doped portion of the semiconductor substrate is considerably higher than that on the undoped portion of the semiconductor substrate. Where the oxide film is grown using an 800° C. wet oxidation process under a condition of implanting As in a concentration of 5E15, the oxidation rate on the doped portion of semiconductor substrate is higher than that on the undoped portion of semiconductor substrate by about 10 times.

The impurity-implanted layer 16 may be formed at the entire portions of the field region 23 or may be formed only at a portion of the field region 23 overlapping with the gate electrode.

Figure 8:
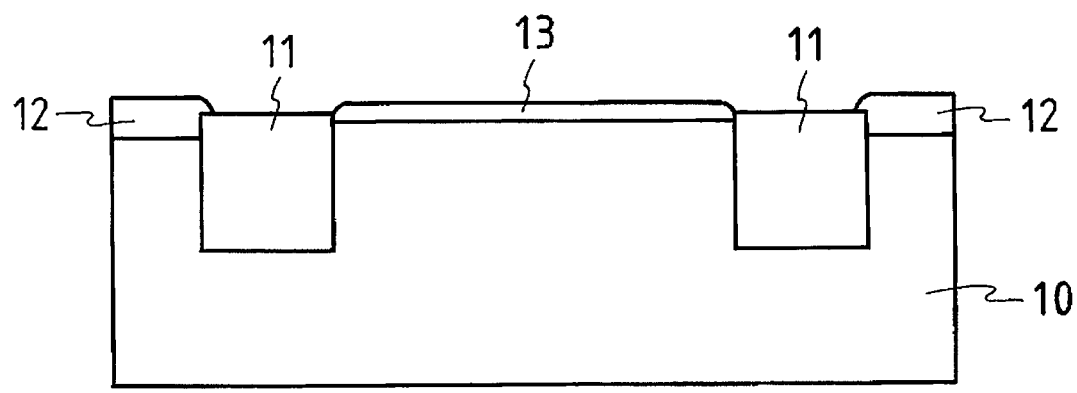

FIG. 8 shows formation of the gate oxide film 13 and the thick oxide film 12. As shown in FIG. 8, the gate oxide film 13 is formed to have a predetermined thickness at the active region by subjecting to an oxidation process the entire exposed surface of the resulting structure obtained after the formation of the impurity-implanted layer 16. By the oxidation process, the thick oxide film 12 is formed on the impurity-implanted layer 16. As mentioned above, the reason why the oxide film 12 has a large thickness is because the growth rate of the oxide film on the impurity-implanted layer 16 is higher than that on the portion of semiconductor substrate 10 corresponding to the active region.

Figure 9:
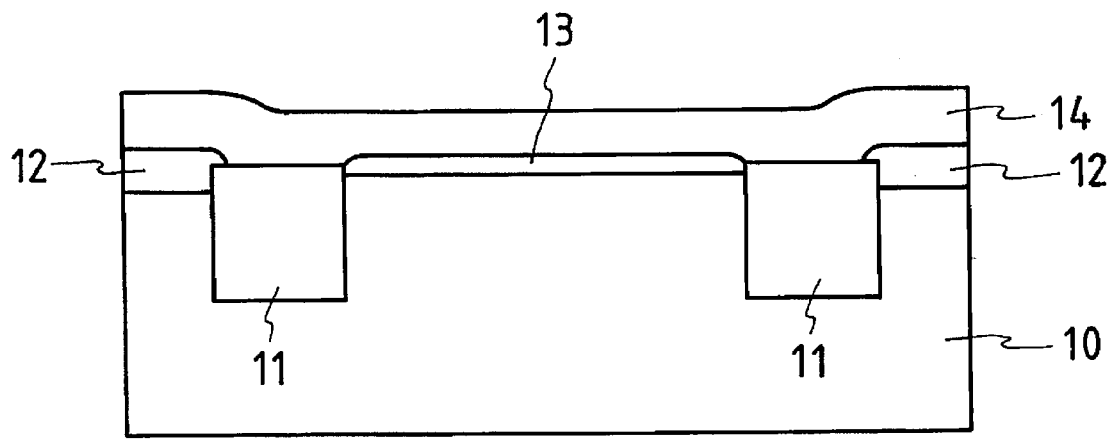

FIG. 9 shows formation of the gate electrode 14. As shown in FIG. 9, the gate electrode 14 is formed such that it overlaps with the thick oxide film 12 even at the field region.

As apparent from the above description, the present invention provides a trench element isolation film formed to have a small width at the boundary between the active region and the field region. Accordingly, it is possible to obtain an improved element isolation function while easily planarizing an insulating film formed in the trench. In accordance with the present invention, a thick oxide film is also formed at the field region provided with no trench, thereby preventing formation of a parasitic capacitor between the semiconductor substrate and the gate electrode. This results in a reduced parasitic capacitance at the field region between the semiconductor substrate and the gate electrode. As a result, it is possible to prevent the operating speed of device from being decreased.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

forming a trench having a predetermined width and a predetermined depth in a portion of a semiconductor substrate corresponding to a boundary between a field region and an active region, and then burying an insulating film in the trench such that the insulating film has a planarized surface, thereby forming a trench element isolation film;

implanting an impurity only in a portion of the semiconductor substrate corresponding to the field region, thereby forming an impurity-implanted layer;

forming a gate oxide film on a portion of the semiconductor substrate corresponding to the active region and a thick oxide film on the impurity-implanted layer at the field region by use of an oxidation process; and forming a gate electrode overlapping with the gate oxide film and the thick oxide film.

2. A method in accordance with claim 1, wherein the impurity of the impurity-implanted layer comprises one selected from a group consisting of arsenic, phosphorous, argon and silicon or a mixture of two impurities selected from the group.

3. A method in accordance with claim 1, wherein the impurity of the impurity-implanted layer has a concentration of 5E14 to 5E16.

4. A method in accordance with claim 1, wherein the impurity-implanted layer is formed at the entire portions of the field region.

5. A method in accordance with claim 1, wherein the impurity-implanted layer is formed only at a portion of the field region overlapping with the gate electrode.

* * * * *